(12) United States Patent
Bi et al.

(10) Patent No.: US 11,404,602 B2
(45) Date of Patent: Aug. 2, 2022

(54) LIGHT-EMITTING DIODE AND METHOD FOR MANUFACTURING THEREOF

(71) Applicant: Anhui Sanan Optoelectronics Co., Ltd., Wuhu (CN)

(72) Inventors: Dongsheng Bi, Wuhu (CN); Kai Xu, Wuhu (CN); Chia-Hao Tsai, Wuhu (CN); Chao-Ming Huang, Wuhu (CN); Chia-Hao Chang, Wuhu (CN)

(73) Assignee: ANHUI SANAN OPTOELECTRONICS CO., LTD., Wuhu (CN)

( * ) Notice: Subject to any disclaimer, the term of this patent is extended or adjusted under 35 U.S.C. 154(b) by 35 days.

(21) Appl. No.: 16/927,313

(22) Filed: Jul. 13, 2020

(65) Prior Publication Data

US 2021/0066540 A1 Mar. 4, 2021

(30) Foreign Application Priority Data

Sep. 4, 2019 (CN) .......................... 201910829999.3

(51) Int. Cl.
*H01L 33/00* (2010.01)
*H01L 33/10* (2010.01)
*H01L 33/56* (2010.01)
*H01L 33/02* (2010.01)
*H01L 33/46* (2010.01)

(52) U.S. Cl.
CPC ...... *H01L 33/0095* (2013.01); *H01L 33/0054* (2013.01); *H01L 33/02* (2013.01); *H01L 33/10* (2013.01); *H01L 33/46* (2013.01); *H01L 33/56* (2013.01); *H01L 2933/0025* (2013.01)

(58) Field of Classification Search
CPC . H01L 33/0054; H01L 33/56; H01L 33/0095; H01L 33/20; H01L 33/10; H01L 33/46; H01L 2933/0008; H01L 2933/0083; H01L 2933/0025; H01L 33/382
See application file for complete search history.

(56) References Cited

U.S. PATENT DOCUMENTS

2016/0343908 A1* 11/2016 Aldaz ...................... H01L 33/22
2017/0040492 A1* 2/2017 Chiu ....................... H01L 33/38
2017/0317301 A1* 11/2017 Xie ...................... H01L 51/0097

* cited by examiner

*Primary Examiner* — Savitri Mulpuri
(74) *Attorney, Agent, or Firm* — Hauptman Ham, LLP

(57) ABSTRACT

The present application relates to the field of semiconductor, especially the Light-Emitting Diode (LED) and a manufacturing method thereof. In some examples, by etching the channel between adjacent light-emitting units, making the high reflection layer at the bottom of the channel, and producing interference fringes through the high reflection layer, and the side of the LED is exposed by using the interference fringes, thereby forming the structure of the groove and the protrusion on the side of the LED. Further, the width of the bottom of the groove can be larger than the width of the opening, and a silicon dioxide layer can be provided on the surfaces of the protrusion structures, which can further improve the luminous efficiency of the LED.

5 Claims, 10 Drawing Sheets

LIGHT-EMITTING DIODE AND METHOD FOR MANUFACTURING THEREOF

TECHNICAL FIELD

The present application relates to the field of semiconductor manufacturing, and in particular, to an Light-Emitting Diode (LED) and a method for manufacturing thereof.

BACKGROUND

The LED structure in the prior art generally includes a substrate, an epitaxial layer disposed on the substrate, and an electrode located on the epitaxial layer. With the popularization of LEDs as lighting devices, improving the luminous efficiency of the LEDs has become an increasingly important process difficulty. The luminous efficiency can be improved by increasing the internal quantum efficiency or the external quantum efficiency. Roughening the surface of the LED has become a conventional process for improving the external quantum efficiency of the LED. Generally, the surface of the LED is coated with a photoresist mask layer, and the surface is roughened by means of exposure, development, and etching processes. However, in the conventional exposure process, the exposure beam is vertically incident on the upper surface of the LED, and there is no way to irradiate the side or effectively irradiate, making it difficult to form an effective patterned mask on the side of the LED, and as a result, the pattern of the mask cannot be transferred to the side of the LED to roughen it.

Therefore, how to roughen the side surface of the LED is a technical problem in the art.

SUMMARY

The present application provides an LED and a method for manufacturing the same, for implementing the formation of a regular patterned structure on the side of the LED.

According to the first aspect of the present application, provided is a method for manufacturing an LED, including the following steps:

providing a substrate to form a plurality of light-emitting units on the substrate, wherein each light-emitting unit includes an epitaxial layer, and a channel is formed between adjacent light-emitting units; manufacturing a patterned mask layer on the sides of the light-emitting units;

etching the sides of the light-emitting units, and transferring the pattern of the mask layer to the sides of the light-emitting units to form a series of regularly arranged structures of groove and protrusion, wherein the structure of groove and protrusion is in the shape of strips and are alternately and regularly arranged in the thickness direction; and separating the light-emitting units to form independent LEDs.

Further, the interference principle of light can be used to expose the side of the LED with interference fringes to form a patterned mask layer, thereby forming regularly arranged structures of groove and protrusion. Specifically, a mask layer is manufactured on the side of the light-emitting unit, and a high reflection layer is manufactured at the bottom of the channel; an exposure beam is vertically incident to the surface of the high reflection layer to form interference fringes of alternating light and dark, and the mask layer forms alternately distributed denatured regions and non-denatured regions under the effect of the interference fringes; and the mask layer is developed with a developing solution to form the mask layer patterned.

Further, manufacturing a mask layer on the side of the light-emitting unit, and manufacturing a high reflection layer at the bottom of the channel includes: first manufacturing a mask layer on the side of the light-emitting unit, and then manufacturing a high reflection layer at the bottom of the channel; or first manufacturing a high reflection layer at the bottom of the channel, and then manufacturing a mask layer on the side of the light-emitting unit.

Further, by adjusting the wavelength of the exposure beam, the thickness of the high reflection layer, and the width of the interference fringe, the spacing distance between adjacent grooves or adjacent protrusions on the side of the light-emitting unit is adjusted.

Further, the high reflection layer includes a metal reflection layer or a distributed Bragg reflection layer, and the reflectivity ranges from 30% to 100%. Preferably, the reflectivity of the high reflection layer ranges from 95% to 99%, and the specular reflection may occur when the exposure beam enters the surface of the high reflection layer. The metal reflection layer includes an aluminum reflection layer or a silver reflection layer.

Further, the thickness of the metal reflection layer is $\lambda/4(2n+1)$, where $\lambda$ is the wavelength of the exposure beam, and n is a natural number of greater than or equal to 0.

Further, the wavelength of the exposure beam ranges from 200 nm to 500 nm. The exposure beam is an I line, a deep ultraviolet, a H line or a G line, and the exposure beam includes a laser.

Further, the bottom of the channel penetrates into the upper surface of the substrate at a certain distance, and the depth thereof is equal to or greater than the thickness of the epitaxial layer. Preferably, the depth of the channel between the adjacent light-emitting units ranges from 2 μm to 10 μm.

Further, the mask layer is a photoresist layer, and the protrusion formed on the side of the LED is composed of an epitaxial layer; alternatively, the mask layer includes a protection layer and a photoresist layer coated on the surface of the protection layer, the protrusion formed on the side of the LED is composed of an epitaxial layer and a protection layer, and the refractive index of the protection layer is less than the refractive index of the epitaxial layer, thus light emission from the side of the LED is facilitated. Preferably, the protection layer includes a silicon dioxide layer, a silicon nitride layer, or a silicon carbide layer. More preferably, the protection layer is a silicon dioxide layer.

Further, the etching method includes wet etching or dry etching. Preferably, the method for forming the structures of groove and protrusion on the side of the epitaxial layer includes wet etching.

Further, when the mask layer includes the protection layer and the photoresist layer coated on the surface of the protection layer, the method of forming the groove and protrusions includes: first corroding the photoresist layer and the protection layer with a mixture of hydrogen fluoride and ammonium hydroxide, then corroding the side of the epitaxial layer with a mixture of sulfuric acid and phosphoric acid, to form the side of the LED with structures of the groove and protrusion. Preferably, the volume ratio of the sulfuric acid to the phosphoric acid ranges from 3:1 to 2:1, and the corrosion temperature of the sulfuric acid and phosphoric acid ranges from 250° C. to 300° C.

Further, the width of the bottom of the groove is greater than the width of the opening. The groove of such a structure is more conducive to light emission from the side of the LED, thereby improving the luminous efficiency of the LED. Preferably, the size of the opening of the groove ranges from 10 nm to 50 nm, the size of the opening of the groove is related to the width of the interference fringe, and the size of the bottom of the groove is related related to the etching temperature, solution, and time. The spacing distance between the grooves ranges from 20 nm to 100 nm.

According to a second aspect of the present application, the present application provides an LED, including a substrate and an epitaxial layer stacked on the substrate. Wherein, the side of the epitaxial layer has a structure of groove and protrusion, and the structure of groove and protrusion is in the shape of strip, arranged alternately and regularly in the thickness direction. A regular pattern is formed on the side of the epitaxial layer, i.e., patterning, in order for the incident light and the reflected light to interfere with each other, the patterning is controlled and adjusted by parameters such as the exposure wavelength, the thickness of the reflective film, and the photoresist etc., to achieve the optimized effect. However, the conventional method of directly total roughening without a mask layer, cannot achieve the patterned control with such high precision. Lots of verifications can prove that patterning can improve the luminous efficiency. The conventional method of directly total roughening without a mask layer can only achieve the purpose of roughing, and the present application can further process the side, and the roughing is more precise and the benefits are more significant.

Preferably, the side of the epitaxial layer has a structure of groove and protrusion, and the width of the bottom of the groove is greater than the width of the opening. The structure of groove and protrusion on the side of the epitaxial layer, on the one hand, changes the path of light incident to the side of the LED, and is facilitate to light emission, on the other hand, increases the contact area between the epitaxial layer and the surrounding medium, and is facilitate to heat dissipation.

Further, the protrusion is composed of an epitaxial layer and a protection layer, and the refractive index of the protection layer is less than the refractive index of the epitaxial layer, thereby facilitating light emission from the side of the LED.

Further, the protection layer is a silicon dioxide layer, a silicon nitride layer, or a silicon carbide layer. More preferably, the protection layer is a silicon dioxide layer.

In some embodiments, before or after the light-emitting unit is separated, a high reflection layer that generates interference fringes may be removed to form an LED, wherein there is no high reflection layer on the side of the LED.

In some examples, the high reflection layer that generates the interference fringes can be retained, to form an LED with a high reflection layer on the side of the bottom of the substrate. The process step of removing the high reflection layer can be simplified, and the retained high reflection layer can change the path of light to the side, so it can improve the luminous efficiency. In this case, the side surface of the epitaxial layer near to the side of the substrate has a high reflection layer. Preferably, the high reflection layer is a metal reflection layer. More preferably, the metal reflection layer includes an aluminum reflection layer or a silver reflection layer.

Further, the height of the high reflection layer ranges from 2 μm to 10 μm.

Further, the size of the opening of the groove ranges from 10 nm to 50 nm, and the size of the opening of the groove is related to the width of the interference fringe as well as the etching temperature, solution, and time.

Further, the spacing distance between the grooves ranges from 20 nm to 100 nm.

The LED and the manufacturing method thereof of the present application have the following beneficial effects:

(1) the interference fringes of the exposure beam are generated by the high reflection layer between the adjacent light-emitting units, and the side of the LED is exposed by the interference fringes, thereby solving the problem that the side of the LED is not easy to expose in the prior art;

(2) a regular pattern and grooves and protrusions in the shape of strips are formed on the side of the LED, and are arranged alternately and regularly in the thickness direction; and (3) the width of the bottom of the groove is greater than the width of the opening; the design structure of the grooves, on the one hand, changes the path of light to the side of the LED, and is facilitate to light emission, on the other hand, increases the contact area between the epitaxial layer and the surrounding medium and is facilitate to heat dissipation.

Other features and advantages of the present application are explained in the following description, and partly described from the description, or understood by implementing the present application. The objects and other advantages of the present application can be achieved and obtained by the structures specifically pointed out in the description, the claims, and the drawings.

BRIEF DESCRIPTION OF THE DRAWINGS

The drawings are used to provide a further understanding of the present application, constitute a part of the description, explain the present application together with embodiments of the present application, and are not intended to limit the present application. In addition, data of the drawings is descriptive in summary rather than drawing the drawings in proportion.

DETAILED DESCRIPTION

The implementations of the present application are described in detail below in conjunction with the accompanying drawings and embodiments, so as to understand how to use technical measures to solve the technical problem in the present application, and fully understand and implement the process of achieving the technical effects. It should be noted that, as long as there is no conflict, the embodiments in the present application and the features in the embodiments can be combined with each other, and the resulting technical solutions all fall within the scope of protection of the present application.

Example 1

Figure 1:
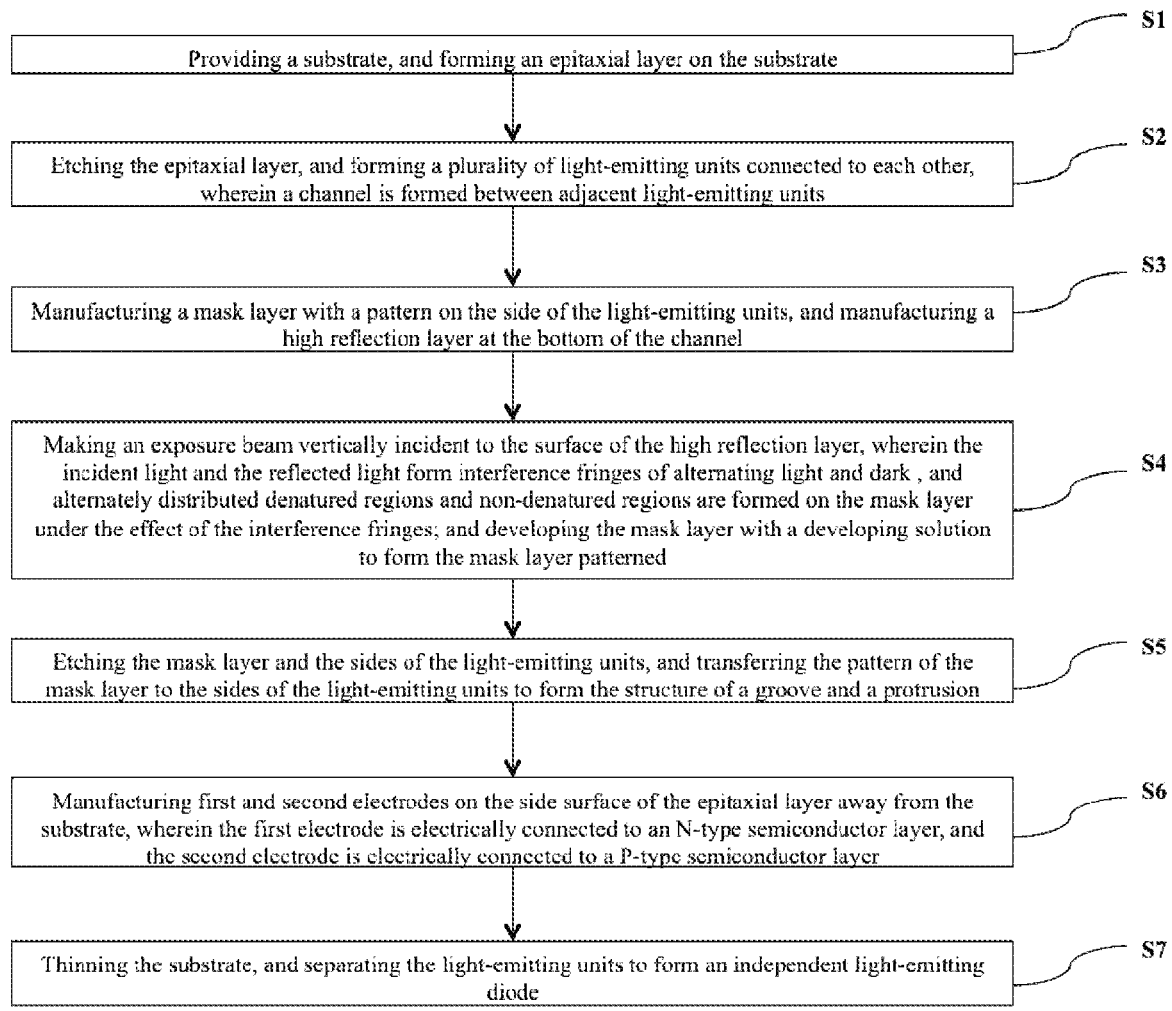
FIG. 1 is a flowchart of a method for manufacturing an LED according to a certain embodiment of the present application.

FIG. 1 is a flowchart of a method for manufacturing an LED according to an embodiment of the present application.

Figure 2:
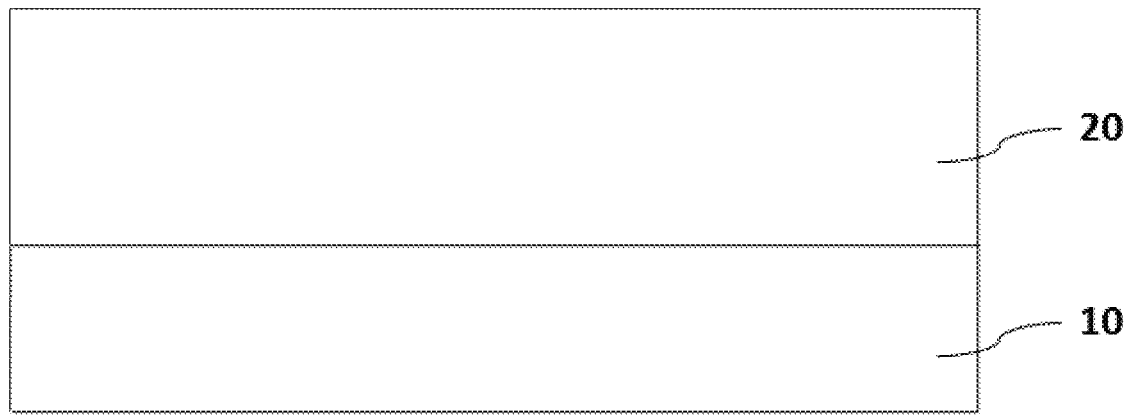
FIGS. 2-8 are schematic diagrams of a process of manufacturing an LED according to a certain embodiment of the present application.

Referring to FIG. 1, the present application provides a method for manufacturing an LED with a structure of groove and protrusion by exposing the side of the LED with interference fringes of an exposure beam, including:

S1, referring to FIG. 2, providing a substrate 10, and forming an epitaxial layer 20 on the substrate 10.

Wherein, the material of the substrate 10 is selected from $Al_2O_3$, SiC, GaAs, GaN, AlN, GaP, Si, ZnO, MnO, and any one of any combination thereof. The epitaxial growing substrate of this example is described by taking a sapphire substrate 10 as an example, with a lattice direction, for example, (0001). However, the present application does not limit the material and lattice direction of the substrate 10 used. The substrate 10 can be patterned to change the propagation path of light, thereby improving the luminous efficiency of the light-emitting element.

The epitaxial layer 20 is manufactured on the substrate 10 by means of Metal Organic Chemical Vapor Deposition (MOCVD), including at least a N-type semiconductor layer, a P-type semiconductor layer, and an light-emitting layer therebetween. The P-type semiconductor layer or the N-type semiconductor layer is respectively n- or p-type doping, and wherein the n-type is doped with a n-type dopant such as Si, Ge, or Sn. The p-type is doped with a p-type dopant such as Mg, Zn, Ca, Sr, or Ba, and doping of equivalent substitution of other elements is not excluded. The P-type semiconductor layer or the N-type semiconductor layer can be a gallium nitride-based, gallium arsenide-based, or gallium phosphide-based material. The light-emitting layer is a material capable of providing light radiation, the specific radiation band is between 390 nm and 950 nm, such as blue, green, red, yellow, orange, and infrared light. The light-emitting layer may be a single-quantum well structure or a multi-quantum well structure.

To improve the growth quality and performance of the epitaxial layer 20, a buffer layer (not shown) can also be grown between the substrate 10 and the N-type semiconductor layer, a stress release layer (not shown) can be grown between the N-type semiconductor layer and the light-emitting layer, and an electron barrier layer (not shown) can be grown between the light-emitting layer and the P-type semiconductor layer, specifically depending on the production needs.

Figure 3:
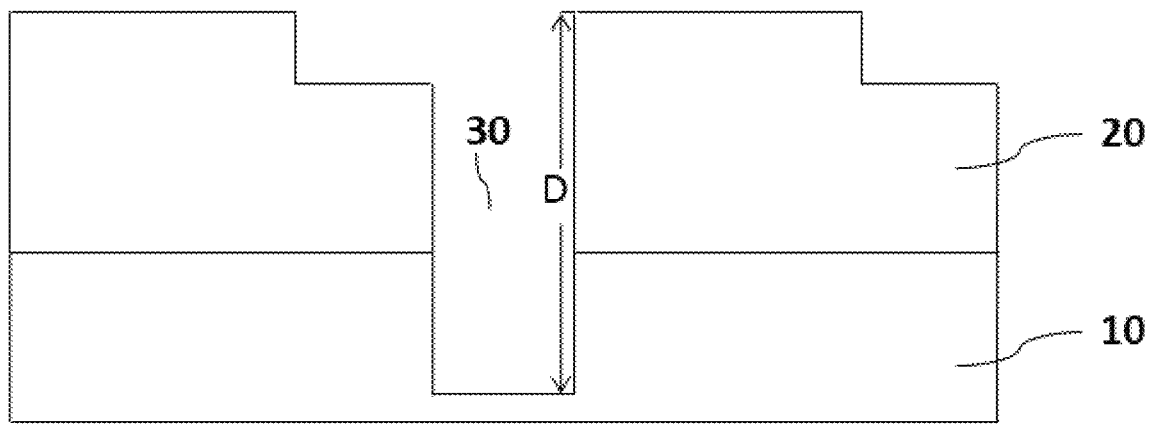

S2, referring to FIG. 3, etching an epitaxial layer 20 to form a plurality of light-emitting units, wherein the light-emitting unit includes the epitaxial layer, and has a channel 30 between adjacent light-emitting units.

The method for etching the epitaxial layer 20 can be dry etching or wet etching. In this example preferably uses dry etching. Specifically, the dry etching method includes the following steps: first etching the P-type semiconductor layer, the light-emitting layer, and a part of the N-type semiconductor layer, and exposing the part of the N-type semiconductor layer; in this case, the epitaxial layer 20 is etched to L-type with a N-type step; then etching the N-type semiconductor layer outside the N-type step to a certain depth of the substrate 10, to form a plurality of light-emitting units connected to each other through the substrate 10, wherein a channel 30 is provided between adjacent light-emitting units, the bottom of both sides of the channel 30 is the side of the substrate 10, and the upper is the side of the epitaxial layer. In this case, each light-emitting unit includes a substrate 10 and an epitaxial layer 20 deposited on the substrate 10. The epitaxial layer 20 includes an N-type layer, an light-emitting layer, and a P-type layer. The bottom of the channel 30 penetrates into the upper surface of the substrate 10 at a certain distance, and the depth of the channel 30 is greater than the thickness of the epitaxial layer 20.

In other examples, it may also be simply etched to the upper surface of the substrate 10, and both sides of the formed channel 30 are the sides of the epitaxial layer 20. In this case, the depth of the channel 30 formed by etching is equal to the thickness of the epitaxial layer 20.

The etching depth depends on the subsequent needs for roughening the side of the substrate 10. If the side of the substrate 10 is needed to roughen, a part of the substrate 10 needs to be etched to form a deep channel 30. If only the side of the epitaxial layer 20 is needed to roughen, it only needs to etch to the surface of the substrate 10.

Figure 4:
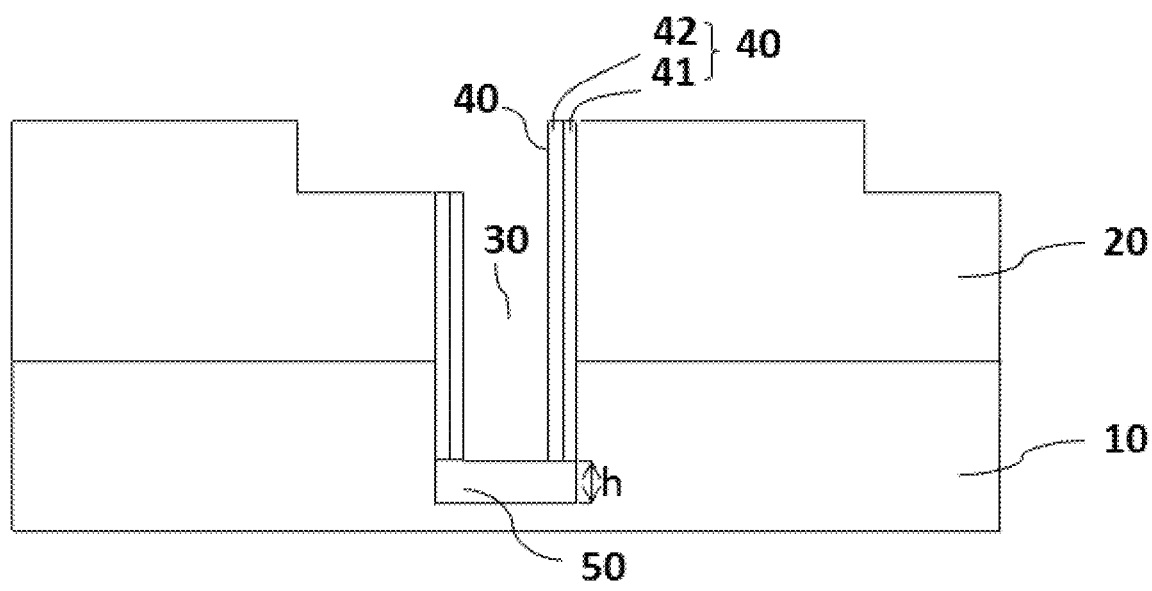

S3, referring to FIG. 4, a mask layer 40 is manufactured on the side of the light-emitting unit, and a high reflection layer 50 is manufactured at the bottom of the channel 30.

Specifically, the mask layer 40 can be first manufactured on the side of the light-emitting unit, and then the high reflection layer 50 can be manufactured at the bottom of the channel 30. Alternatively, the high reflection layer 50 is first manufactured at the bottom of the channel 30, and then the mask layer 40 is manufactured on the side of the light-emitting unit. The present application does not limit the order of forming the mask layer 40 and the high reflection layer 50.

In this example, the mask layer 40 includes a protection layer 41 and a photoresist layer 42 coated on the surface of the protection layer 41. Through the photolithography process, the protrusion 81 on the side of an LED subsequently formed is composed of the epitaxial layer 20 and the protection layer 41, wherein the refractive index of the protection layer 41 is less than the refractive index of the epitaxial layer 20, which is facilitate to light emission from the side of the LED. The protection layer 41 can include a silicon dioxide layer, a silicon nitride layer, or a silicon carbide layer. Preferably, the protection layer 41 is a silicon dioxide layer.

Generally, the refractive index of the epitaxial layer 20 is about 2.5, and the refractive index of the air is about 1, and when light propagates from the denser medium to the sparse medium, it is easy to appear full reflection, which makes the light cannot be efficiently extracted. Therefore, when the protrusion 81 is composed of the epitaxial layer 20 and the silicon dioxide layer, the refractive index of silicon dioxide is about 1.45, and the light on the side of the LED is incident to the silicon dioxide layer (refractive index 1.45) from the epitaxial layer 20 (refractive index 2.5), and then to the air (refractive index 1), so that the amount of light that is fully reflected is reduced, thereby improving the luminous efficiency of the side of the LED.

In other examples, the mask layer 40 can be only the photoresist layer 42. In this case, through the photolithography process, the protrusion 81 on the side of the LED subsequently formed is composed of the epitaxial layer 20, wherein the luminous efficiency thereof is lower than the luminous efficiency of the LED with the protrusion 81 composed of the epitaxial layer 20 and the protection layer 41.

Figure 6:
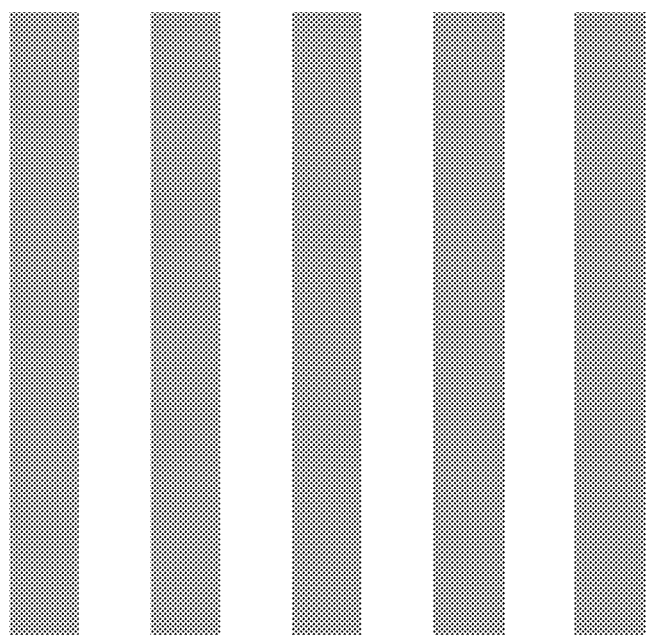

The high reflection layer 50 can be manufactured at the bottom of the channel 30 by vacuum evaporation, sputtering, or chemical vapor deposition, especially, the high reflection layer 50 is manufactured on the surface of the substrate 10 in the channel 30. The effect of the high reflection layer 50 is to produce interference fringes T (as shown in FIG. 6) in the subsequent exposure process. Therefore, the reflectivity of the high reflection layer 50 ranges from 30% to 100%. Furthermore, the higher the reflectivity of the high reflection layer 50, the better the reflectivity range can reach 95-99%. Optimally, specular reflection can occur when the exposure beam hits the high reflection layer 50, at this point, the interference fringes T produced by the high reflection layer 50 are clearer. Therefore, the high reflection layer 50 can be a metal reflection layer or a distributed Bragg reflection layer, preferably is a metal reflection layer. More preferably, the high reflection layer 50 includes an aluminum reflection layer or a silver reflection layer.

The spacing distance between adjacent grooves or adjacent protrusions 81 on the side of the light-emitting unit is adjusted by adjusting the wavelength of the exposure beam, the thickness of the high reflection layer 50, and the width of the interference fringe T. Specifically, the thickness h of the metal reflection layer 50 and the wavelength λ of the exposure beam have the following relationship: $h=\lambda/4(2n+1)$, wherein n is a natural number greater than or equal to 0. In this example, preferably the thickness of the high reflection layer 50 is $h=\lambda/4$ (n=0), wherein, the interference phase difference generated by the incident light (L1) and the reflected light (L2) of the exposure beam is about 2l4.

Figure 5:
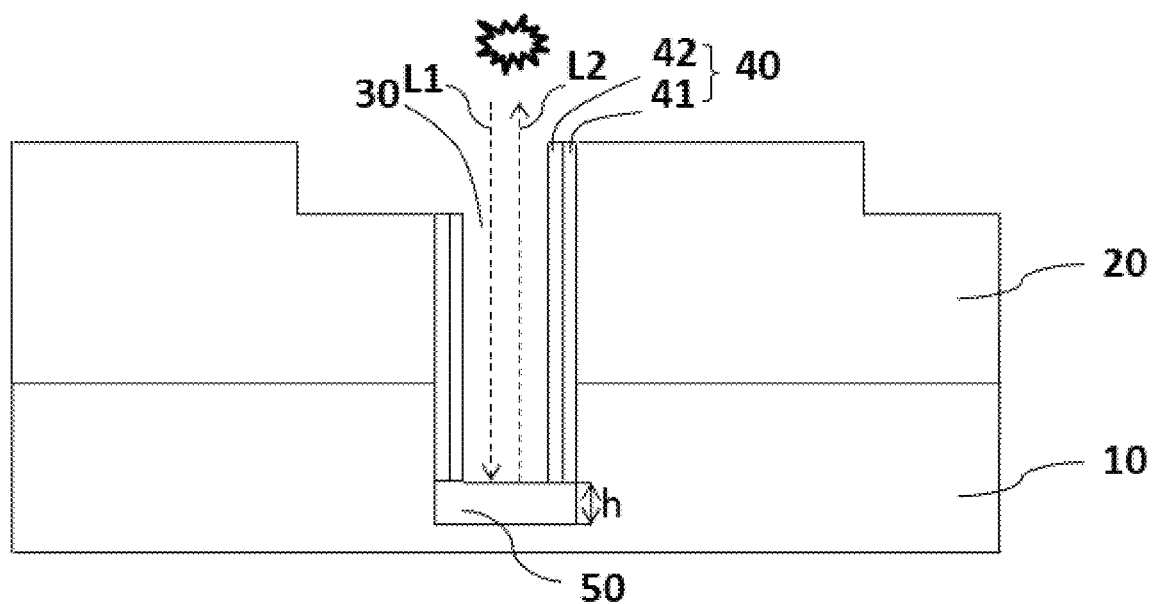

S4, referring to FIG. 5, the exposure beam is vertically incident to the surface of the high reflection layer 50, and the incident light (L1) and the reflected light (L2) form interference fringes T of alternating light and dark (as shown in FIG. 6). Under the effect of the interference fringes T, the mask layer 40 forms denatured regions and non-denatured regions with alternating distribution. The mask layer 40 is developed with a developing solution to form a patterned mask layer 40.

The wavelength of the exposure beam ranges from 200 nm to 500 nm. Preferably, the exposure beam is an I line, a deep ultraviolet, a H line or a G line. More preferably, the exposure beam includes a laser.

Figure 7:
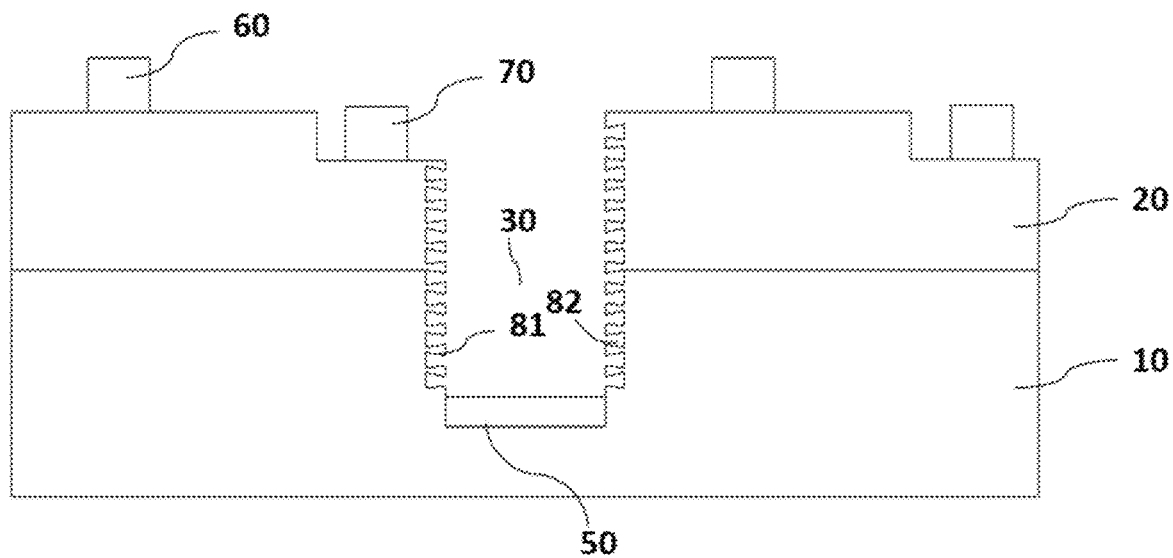

S5, referring to FIG. 7, etching the mask layer 40 and the side of the light-emitting unit, and transferring the pattern of the mask layer 40 to the side of the light-emitting unit to form a series of regular structures of groove 82 and protrusion 81, and the structures of the groove 82 and protrusion 81 are in the shape of strips and are alternately regular-arranged in the thickness direction.

The method for forming the patterned mask layer is generally the first expose of the photoresist and later development. The exposure process is generally to irradiate the exposure beam on the surface of the photoresist to expose the photoresist. For the side of the LED, when LED is placed in an exposure device, the exposure beam is generally irradiated from the top of the epitaxial wafer, and its side cannot obtain effective irradiation by the exposure beam, as a result, a patterned mask cannot be formed. The regular pattern on the side of the LED is formed by transferring the pattern of the patterned mask to the side of the epitaxial layer. Therefore, the conventional photolithography process cannot form a regular pattern on the side of the LED. The present application adopts the principle of interference fringes, so that the patterned mask layer can be formed on the side of the epitaxial layer, and the regular groove and protrusion patterns on the side of the LED can be further formed by the pattern transfer step.

In the present application, the method of dry etching or wet etching can be used to etch the mask layer 40 and the side of the light-emitting unit. In this example, the method of wet etching is preferably used. Specifically, when wet etching is performed on the mask layer 40 composed of the protection layer 41 and the photoresist layer 42 coated on the surface of the protection layer 41, first, the mixture of hydrogen fluoride and ammonium hydroxide is used to corrode the photoresist layer 42 and protection layer 41, wherein the protection layer 41 is preferably a silicon dioxide layer; then the mixture of sulfuric acid and phosphoric acid is used to corrode the side of the epitaxial layer 20, to form the side of the LED with the structure of groove 82 and protrusion 81.

Further, when the mask layer 40 is wet-etched, the volume ratio of the sulfuric acid to the phosphoric acid ranges from 3:1 to 2:1, and the corrosion temperature ranges from 250° C. to 300° C.

S6, referring to FIG. 7, the first electrode 60 and the second electrode 70 are manufactured on the side surface of the epitaxial layer 20 away from the substrate 10. The first electrode 60 is electrically connected to the N-type semiconductor layer, and the second electrode 70 is electrically connected to the P-type semiconductor layer. The first electrode 60 and the second electrode 70 are respectively connected to two poles of an external power source, and the current is injected into the P-type semiconductor layer from the second electrode 70 and flows through the epitaxial layer 20 to the first electrode 60, so that the epitaxial layer 20 emits light of a certain wavelength.

Figure 8:
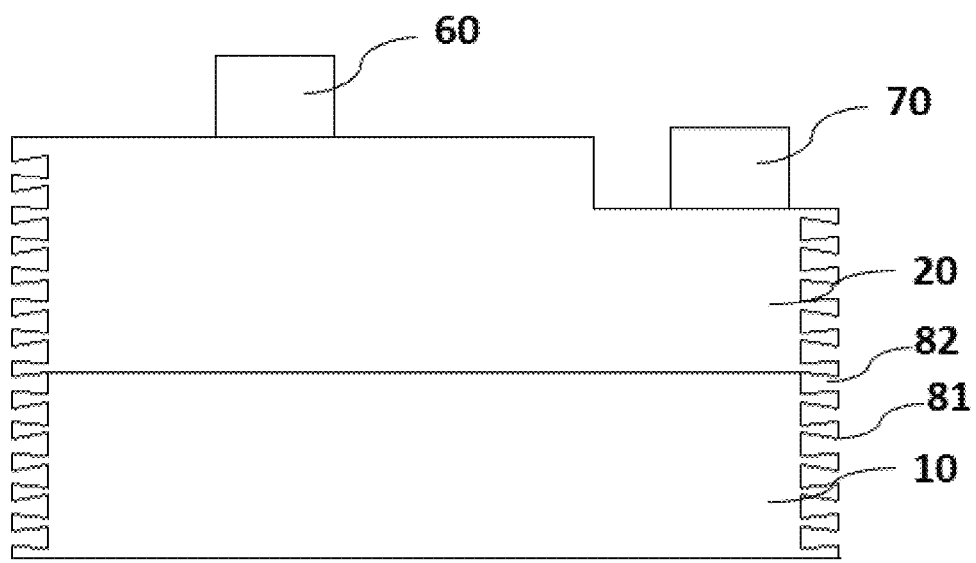

S7, referring to FIG. 8, thinning the substrate 10 and separating the light-emitting units to form an independent LED.

The substrate can be thinned by grinding the back of the substrate 10. For the LED formed by the above method, the width of the bottom of the groove 82 on its side is larger than the width of the opening, and the groove 82 of this structure is more favorable to the light emission from the side of the LED, and improves the luminous efficiency of the LED. The width of the bottom of the groove 82 is larger than the width of the opening, the structure of groove 82 and protrusion 81 on the side of the epitaxial layer 20, on one hand, change the path of light incident to the side of the LED, which is more favorable to light emission, and on the other hand, increase the contact area between the epitaxial layer 20 and the surrounding medium, which is more favorable to heat dissipation.

The size of the opening of the groove 82 ranges from 10 nm to 50 nm, and the size of the opening of the groove 82 is related to the width of the interference fringe T and the etching temperature, solution, and time. The spacing distance between the grooves 82 on the side of the light-emitting unit ranges from 20 nm to 100 nm.

Example 2

FIG. 8 shows a schematic diagram of the structure of the LED of the present application. The LED disclosed in the present application is made using the method of Example 1. Specifically, an LED includes a substrate 10 and an epitaxial layer 20 stacked on the substrate 10, the side of the epitaxial layer 20 has a structure of groove 82 and protrusion 81, and the width of the bottom of the groove 82 is larger than the width of the opening.

The structure of groove 82 and protrusion 81 on the side of the epitaxial layer 20, on one hand, changes the path of light incident to the side of the LED, which is favorable to light emission, and on the other hand, increases the contact area between the epitaxial layer 20 and the surrounding medium, which is favorable to heat dissipation.

Figure 9:
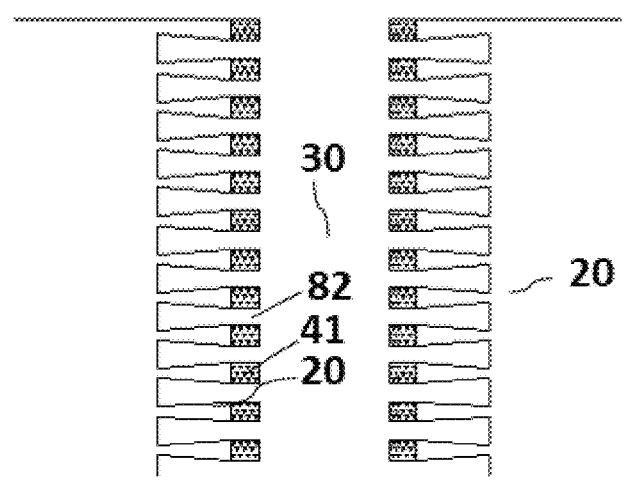
FIG. 9 is a local schematic diagram of the side of an LED according to a certain embodiment of the present application.

Referring to FIG. 9, in this example, the protrusion 81 is composed of an epitaxial layer 20 (in some modified examples, it can be the epitaxial layer 20 and/or the substrate 10) and a protection layer 41, and the refractive index of the protection layer 41 is less than the refractive index of the epitaxial layer 20, so that light emission from the side of the LED can be facilitated. The protection layer 41 can be a silicon dioxide layer, a silicon nitride layer, or a silicon carbide layer. In this example, the protection layer 41 is preferably a silicon dioxide layer.

Figure 10:
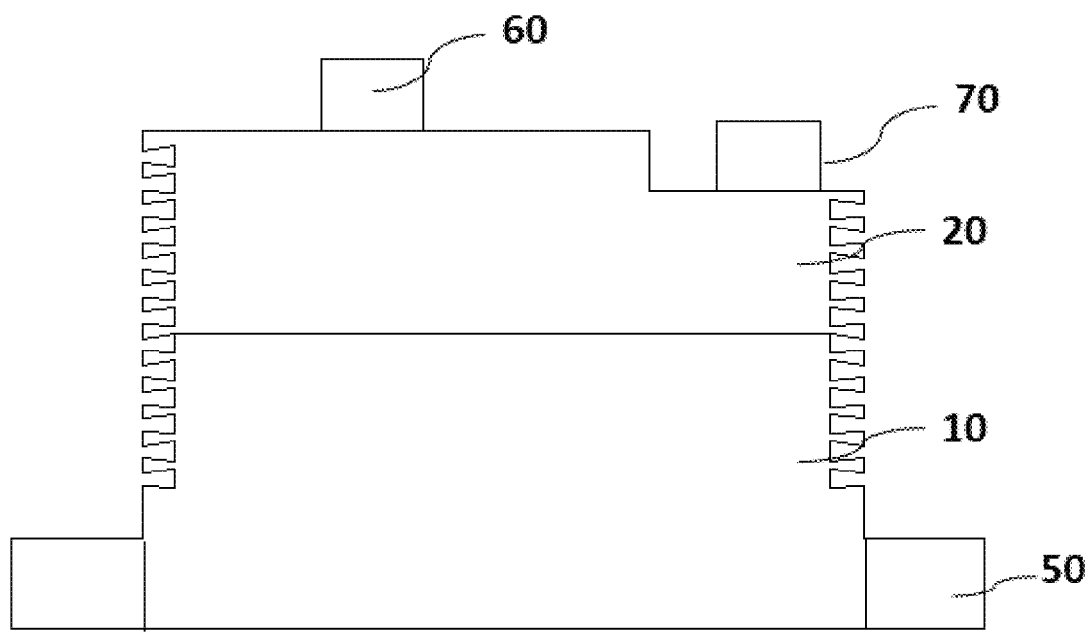
FIG. 10 is a schematic diagram of the structure of an LED according to other embodiments in certain embodiments of the present application.

As shown in FIG. 8, the high reflection layer 50 that generates the interference fringes T can be removed, and then the substrate 10 is thinned, to form an LED with the structure of the groove 82 and protrusion 81 without high reflection layer 50 on the side. Alternatively, in other examples, as shown in FIG. 10, the high reflection layer 50 that generates the interference fringes T is retained, and in this case an LED with the high reflection layer 50 on the side is formed. On one hand, retaining the high reflection layer 50 can omit the process step of removing the high reflection layer 50, and on the other hand, retaining the high reflection layer 50 can change the path of the light incident to the side, thereby also facilitating the improvement of the luminous efficiency. The high reflection layer 50 can be a metal reflection layer, such as an aluminum reflection layer or a silver reflection layer.

Wherein, the size of the opening of the groove 82 on the side of the light-emitting unit ranges from 10 μm to 50 μm, and the size of the opening of the groove 82 is related to the width of the interference fringe T and the etching temperature, solution, and time. The spacing distance between the grooves 82 ranges from 20 μm to 100 μm.

The LED and the manufacturing method thereof of the present application have the following beneficial effects:

(1) the interference fringes T of the exposure beam is generated by using the high reflection layer 50 between adjacent light-emitting units, further transferring the pattern of the interference fringes T to the side of the LED, and forming the LED with the grooves 82 and the protrusions 81 by means of developing and etching steps, which solves the problem that the side of the LED is difficult to expose in the prior art; and (2) the side of the LED formed has a strip-shaped structure of groove 82 and protrusion 81 which is arranged alternately and regularly in the thickness direction, and the width of the bottom of the groove 82 is larger than the width of the opening; on one hand, the path of light incident to the side of the LED is changed, which is more favorable to light emission, and on the other hand, the contact area between the epitaxial layer 20 and the surrounding medium is increased, which is more favorable to heat dissipation.

The above is merely preferred examples of the present application, and is not intended to limit the present application. Any modification, equivalent substitution, improvement, etc. made within the spirit and principle of the present application should fall within the scope of protection of the present application.

The invention claimed is:

1. A Light-Emitting Diode (LED), comprising
a substrate and an epitaxial layer stacked on the substrate, wherein the side of the epitaxial layer is provided with a structure of a groove and a protrusion; and the structure of the groove and the protrusion is in the shape of strip, and is alternately and regularly arranged in a thickness direction, wherein
the protrusion is composed of an epitaxial layer and a protection layer, and a refractive index of the protection layer is less than a refractive index of the epitaxial layer, and
a side surface of the epitaxial layer is in contact with a high reflection layer, wherein the high reflection layer comprises metal or a Bragg reflection layer, and the high reflection layer is in contact with the substrate.

2. The LED according to claim 1, wherein a width of a bottom of the groove is larger than a width of an opening.

3. The LED according to claim 1, wherein the protection layer is a silicon dioxide layer, a silicon nitride layer, or a silicon carbide layer.

4. The LED according to claim 1, wherein a size of the opening of the groove on a side of the light-emitting unit is 10 nm to 50 nm.

5. The LED according to claim 1, wherein a spacing distance between the groove on the side of the light-emitting unit is 20 nm to 100 nm.

* * * * *